United States Patent [19]

Gualtieri et al.

[11] Patent Number: 4,520,460

[45] Date of Patent: May 28, 1985

[54] TEMPERATURE STABLE MAGNETIC BUBBLE COMPOSITIONS

[75] Inventors: Devlin M. Gualtieri, Ledgewood; Paul F. Tumelty, Morristown, both of N.J.

[73] Assignee: Allied Corporation, Morris Township, Morris County, N.J.

[21] Appl. No.: 523,245

[22] Filed: Aug. 15, 1983

[51] Int. Cl.³ .................. G11C 19/08; C04B 35/40
[52] U.S. Cl. .................. 365/33; 252/62.57; 252/62.59; 252/62.63; 428/693; 428/900
[58] Field of Search ............ 252/62.57, 62.59, 62.63; 428/692, 693, 700, 900; 365/33

[56] References Cited

U.S. PATENT DOCUMENTS

| | | | |
|---|---|---|---|
| 3,156,651 | 11/1964 | Geller | 252/62.59 |
| 3,613,056 | 10/1971 | Bobeck et al. | 252/62.57 |
| 3,711,841 | 1/1973 | Geusic et al. | 365/28 |
| 3,886,533 | 5/1975 | Bonner et al. | 252/62.57 |
| 3,964,035 | 6/1976 | Blank et al. | 252/62.57 |
| 4,002,803 | 1/1977 | Blank | 428/693 |
| 4,034,358 | 7/1977 | Blank | 252/62.57 |
| 4,165,410 | 8/1979 | Blank | 428/692 |
| 4,263,374 | 4/1981 | Glass et al. | 252/62.57 |
| 4,419,417 | 12/1983 | LeCraw et al. | 428/700 |
| 4,433,034 | 2/1984 | Gualtieri et al. | 252/62.57 |

FOREIGN PATENT DOCUMENTS

| | | | |
|---|---|---|---|
| 0113306 | 9/1980 | Japan | 252/62.63 |
| 0130881 | 10/1981 | Japan | 365/33 |
| 0130882 | 10/1981 | Japan | 365/33 |
| 2009730 | 6/1979 | United Kingdom | 252/62.57 |

OTHER PUBLICATIONS

S. L. Blank et al., J. Appl. Phys. 50, 2155, (1979), "Design and development of single-layer, ion-implantable small bubble materials for magnetic bubble devices".

Primary Examiner—L. Dewayne Rutledge
Assistant Examiner—Robert L. McDowell
Attorney, Agent, or Firm—James Riesenfeld; Gerhard H. Fuchs

[57] ABSTRACT

Certain Tm-containing iron garnet compositions provide layers having desirably high values of Curie temperature and magnetic anisotropy and permit the fabrication of devices having 1.2 μm diameter magnetic bubbles. The compositions, based on Tm-substitution on dodecahedral sites of $[(La,Bi)(Sm,Eu),(Ca,Sr),R]_3(Fe,Si,Ge)_5O_{12}$, are grown by liquid phase epitaxy onto suitable substrates. Bubble devices that incorporate the layers find applications in high density information storage.

5 Claims, 1 Drawing Figure

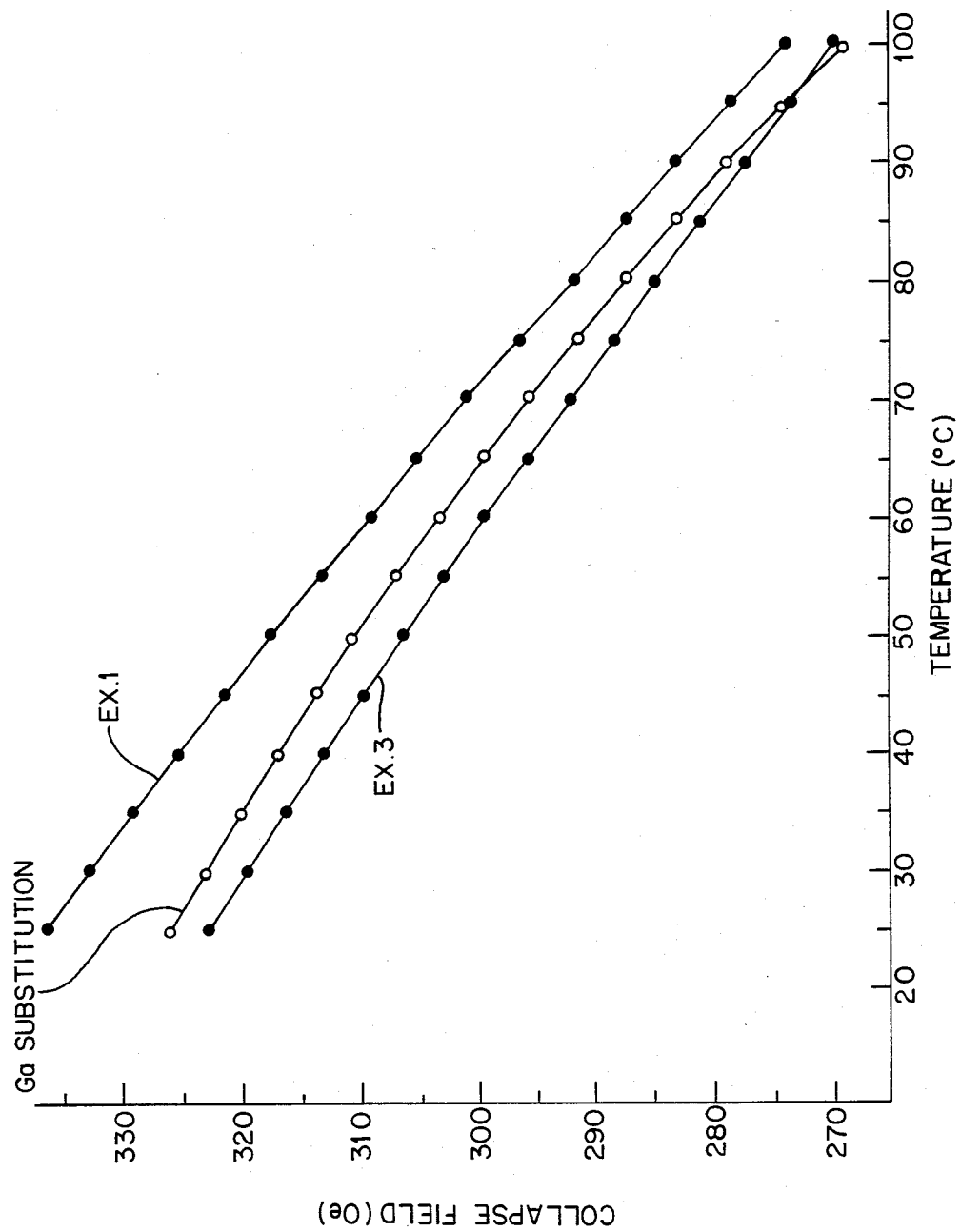

ical Phys. 50, 2155 (1979). Within that system, they
TEMPERATURE STABLE MAGNETIC BUBBLE COMPOSITIONS

BACKGROUND OF THE INVENTION

1. Field of the Invention

This invention relates to magnetic bubble devices, and, more particularly, to certain substituted iron garnet compositions for use in those devices.

2. Description of the Prior Art

A magnetic bubble memory consists of a thin film of magnetic garnet or other magnetic material in which microscopic cylindrical magnetic domains may be generated and moved. The axes of the domains are normal to the film surface; thus, when viewed end on (using polarized light) the domains have the appearance of small disks or "bubbles." In operation, the film is maintained in a bias field directed normal to the film. The magnitude of the bias field is kept within the range over which the bubbles are stable. At the lower limit of that range, the "strip-out field," the bubbles grow until they distort into elongated strips. At the upper limit, the bubbles collapse. Controlled perturbations of the magnitude and direction of the magnetic field near the bubbles are used to move the bubbles. To provide the greatest operating latitude, the bias field is set in the middle of the stable range, providing a characteristic bubble diameter. The smaller the bubble diameter, the greater the amount of information that can be stored in a particular area.

The diameter, d, of a magnetic bubble domain can be related to the characteristic length parameter, l $$l = (AK_u)^{\frac{1}{2}} / \pi M_s^2$$

where A is the magnetic exchange constant, $K_u$ is the uniaxial magnetic anisotropy constant, and $M_s$ is the saturation magnetization. Nominal bubble diameter is d=8l. Magnetization, as seen, plays an important role in determining the bubble size. Iron garnets such as $(Y,Sm)_3Fe_5O_{12}$ have a magnetization too high to support stable bubbles near 1.5 µm diameter. Ge, Al, Ga, or another element is often substituted for Fe on the tetrahedral crystal site in these iron garnets to reduce the net magnetic moment of the iron sublattices and thereby the magnetization of the garnet bubble material.

One deleterious side effect of such a substitution is that the Curie temperature, the temperature at which the magnetization drops precipitously to nearly zero, is decreased. For example, it has been noted (U.S. Pat. No. 3,886,533) that Ga substitution for Fe results in a substantial lowering of the Curie temperature. The region of large change in magnetization with temperature, which is near the Curie temperature, is thus reduced to near the operating temperature range of a magnetic bubble memory device. A large temperature variation of the magnetization prevents the usual method of temperature stabilization of bubble memory devices; that is, adjustment of the temperature variation of the magnetic properties of the bubble material, principally the bubble collapse field, to about that of the temperature variation of the magnetization of the biasing magnet (U.S. Pat. No. 3,711,841).

(Ca,Ge)-substituted iron garnet compositions of the $(La,Lu,Sm,Ca)_3(Fe,Ge)_5O_{12}$ system were studied for use as "small bubble materials" by S. L. Blank et al., J. Appl. Phys. 50, 2155 (1979). Within that system, they identified a composition that is suitable as a 1.1 µm bubble material. However, that composition has limited usefulness, because the temperature coefficient of the bubble collapse field ($\alpha_{bc}$) is too large.

In a series of patents issued to Blank (U.S. Pat. Nos. 4,002,803; 4,034,358; and 4,165,410), iron garnet systems using (Ca,Sr)- and (Ge,Si)-substitution for iron were disclosed, including various compositions that are suitable for layers capable of supporting stable magnetic bubbles. Among the compositions are ones that contain rare earth elements such as thulium (Tm) in octahedral sites in a relative molar concentration of from 0.01 to 0.1 per formula unit. Over a temperature range, the bubble collapse field for these compositions is claimed to vary with temperature at approximately the same average rate as the bias field variation with temperature over that range. U.S. Pat. No. 4,034,358 discloses a composition of the type $R_{3-a}(Ca,Sr)_aGe_aFe_{5-a}O_{12}$ where R is yttrium or a rare earth element having atomic number between 57 and 71.

SUMMARY OF THE INVENTION

In accordance with the present invention, an iron garnet layer that is capable supporting magnetic bubble domains is provided. The layer composition is nominally represented by the formula $(La,Bi)_a(Sm,Eu)_bTm_c(Ca,Sr)_dR_{3-a-b-c-d}Fe_{5-d}(Si,Ge)_dO_{12}$ where R is at least one element of the group consisting of yttrium and the elements having atomic number from 57 to 71, a is from about 0.05 to about 0.20, b is from about 0.50 to about 0.90, c is from about 0.40 to about 1.20 and, d is from about 0.40 to about 0.65.

The notation $(X,Y)_a$ as used in the specification and appended claims is understood to mean that element X and Y are present in a combined quantity "a" in the formula unit, but the possibility that either X or Y absent is not ruled out; e.g., $X_a$ is included.

In a preferred embodiment of the present invention, a magnetic bubble domain device comprises an iron garnet layer as described above; a magnet for maintaining in the layer a magnetic field that varies with temperature throughout a temperature range at an average variation rate; means adjacent to the layer for generating and moving the domains in the layer; and a substrate for supporting the device, whereby a bubble collapse field of the layer varies with temperature throughout the temperature range at about the average variation rate.

The garnet layers (or films) of the present invention may be grown by liquid phase epitaxy onto suitable substrates to provide a 1.2 µm bubble diameter film having high Curie temperature, $T_c$, and, as a consequence, a linear temperature profile of the bubble collapse field over the normal operating temperature range of these devices. The film also has the high magnetic anisotropy needed for bubble devices.

BRIEF DESCRIPTION OF THE DRAWING

The FIGURE shows the temperature dependence of the bubble collapse field for two compositions of this invention and one of the prior art.

DETAILED DESCRIPTION OF THE INVENTION

The present invention provides film compositions suitable for use in computer memory devices of 4 Mbit/cm² storage density. The compositions are based on a (Ca,Sr),(Si,Ge)-substituted iron garnet, where (La,Bi), (Sm,Eu), Tm, and, optionally, one or more other rare earth elements or yttrium are incorporated into the garnet lattice at dodecahedral sites. The compositions provide a lower $|\alpha_{bc}|$ than did the compositions of the prior art, thus permitting the bubble memory devices that use the compositions to operate over a larger temperature range.

The prototypical iron garnet material is YIG, whose composition is routinely specified as $Y_3Fe_5O_{12}$. That formula is based on the number of dodecahedral, octahedral, and tetrahedral sites in the lattice and assumes, for example, that Y occupies all the dodecahedral sites and no others. In fact, it is well known (see, e.g., D. M. Gualtieri et al., J. Appl. Phys. 52, 2335 (1981)) that Y substitutes to varying degrees for Fe on octahedral sites. Thus, the subscripts in the chemical formula for YIG, as well as for the other iron garnets described in this specification and in the claims, are nominal.

The identification of suitable magnetic bubble compositions based on YIG involves substituting for Y and Fe the appropriate cations, in the appropriate amounts, and at the appropriate lattice sites. In order to provide growth-induced uniaxial anisotropy (which permits fabrication of planar devices, without substrate bowing or other distortions that accompany strain-induced anisotropy), Sm or Eu or both are substituted for Y. Additional growth-induced anisotropy results if a small ion, such as Lu, is also added. To compensate for the reduction in lattice constant that would otherwise result, (La,Bi) substitution may be made at a level necessary to achieve a match to the substrate lattice constant. In the limit, Y may be entirely replaced with Sm, La, and Lu. However, the magnetization of that composition is too high to support stable bubbles in the range of diameters $d \approx 1.5$ μm. Thus, Ge, with charge compensation from Ca, may be substituted for Fe in order to reduce the magnetization. A resulting composition, $(La,Sm,Lu,Ca)_3(Fe,Ge)_5O_{12}$, has been studied by S. L. Blank et al., op. cit. More generally, Sr and Si can partially or totally replace Ca and Ge, respectively. These compositions, of the general formula $(La,Bi)_a(Sm,Eu)_b(Ca,Sr)_cR_{3-a-b-c}Fe_{5-c}(Si,Ge)_cO_{12}$, have a comparatively low Curie temperature, which in turn results in an undesirably large $|\alpha_{bc}|$ in the normal operating temperature range (T~0°–100° C.). In order to overcome this effect, the present invention involves substitution of Tm at dodecahedral lattice sites.

The effect of Tm may be understood by first considering a garnet in which the rate earth has a magnetic moment; e.g., GdIG. If the GdIG lattice is thought of as a combination of individual sublattices, then the dodecahedral (or "c") sublattice, which is occupied by Gd cations, has a larger temperature coefficient of magnetization than do the "a" and "d" sublattices, occupied by Fe. The net magnetization of the crystal, M, is given by $M = M_d - M_a - M_c$, where, generally, $M_a \approx 2M_d/3$. M, as well as its temperature variation, depend critically on the nature of the cations on the c-sublattice. The c-sublattice magnetization is large for some cations. Tm, for example, has such a large magnetic moment that $Tm_3Fe_5O_{12}$ has a compensation point in its variation of magnetization with temperature; that is, a temperature at which the c-sublattice magnetization just balances the net magnetization of the Fe-sublattices. Likewise, small substitutions of Tm for Y (which has no magnetic moment) in $Y_3Fe_5O_{12}$ cause a decrease in M.

Incorporation of Tm into a magnetic bubble composition, taking care to assure correct lattice parameter match between the magnetic film and a nonmagnetic substrate, would allow less (Si,Ge)-substitution for Fe for the same bubble diameter. The temperature dependence of the magnetization in the operating region of the bubble device is decreased, and this allows stable operation of the bubble device over a larger temperature range.

Thus, the present invention concerns the dodecahedral (c-sublattice) incorporation of Tm ions as a means for reducing the net magnetization of the material to allow reduced cationic substitution for Fe for a given magnetization. In order to permit Tm-substitution while maintaining the same lattice constant, the rare earth elements being replaced by Tm in $(La,Bi)_a(Sm,Eu)_b(Ca,Sr)_cR_{3-a-b-c}Fe_{5-c}(Si,Ge)_cO_{12}$ preferably include at least one whose cationic size is less that that of Tm. Thus, in $Tm_c(La,Sm,Lu)_{3-c-d}(Ca,Sr)_dFe_{5-d}(Si,Ge)_dO_{12}$, a preferred composition, Lu is smaller than Tm, and while Tm-substitution for Lu desirably reduces net magnetization and $|\alpha_{bc}|$, it also causes undesirable lattice mismatch with a substrate.

Since the primary purpose of La or Bi in the composition is to increase the lattice constant of the magnetic film to match it to the substrate, the amount of (La, Bi) can be adjusted to allow for the replacement of Lu with Tm. Likewise, substituting less (Si,Ge)—and, for charge compensation, (Ca,Sr)—for Fe can be compensated by removing (La,Bi) to maintain the lattice parameter match between film and substrate. The actual amount of Tm incorporated depends on the value of the temperature dependence of the magnetization required to suit device properties.

Characteristics of an ideal iron garnet bubble memory composition for use with bubble diameters of about 1.2 μm can be identified. As was discussed above, a low value of $|\alpha_{bc}|$ in the temperature range between about 0° and 100° C. requires a relatively high Curie temperature, which translates into a minimum value for the exchange constant, A. The bias field, $H_o$, should be as low as possible, consistent with an anisotropy field, $H_k$, that is high enough to provide stable bubbles. A quality factor, Q, for bubble stability is defined by $Q = H_k/4\pi M_s$.

Barium ferrite is a preferred material for providing the bias field, and its temperature coefficient of magnetization should be matched by $\alpha_{bc}$ of the film. Gadolinium gallium garnet (GGG) is a preferred substrate material and the preferred orientation of the GGG substrate is (111). To avoid undesirable bowing that otherwise results, film lattice constant, corrected for strain induced when the film is deposited on the substrate, should closely match substrate lattice constant. Optimum values of parameters for a 1.2 μm bubble film appear in Table 1.

TABLE 1

| | |
|---|---|
| Exchange constant (erg/cm) | $A > 2.45 \times 10^{-7}$ |
| Thickness (μm) | $0.90 \leq h \leq 1.30$ |
| Stripe width (μm) | $1.00 \leq w \leq 1.40$ |
| Collapse field (Oe) | $300 \leq H_o \leq 350$ |
| Anisotropy field (Oe) | $1800 \leq H_k \leq 2200$ |
| Quality factor | $Q \geq 2.8$ |
| Temperature coefficient of the bubble collapse field (%/°C. at 50° C.) | $0.21 \leq |\alpha_{bc}| \leq 0.23$ |
| Film/substrate lattice constant mismatch (corrected for strain) | $|\Delta a| < 0.3$ pm |

Film thickness should be about 0.8 times the stripe width of the finished film, dictated by considerations of maximum bubble stability consistent with sufficient fringing field for easy bubble detection. Since it is sometimes desirable to implant certain ions subsequent to film growth, "as grown" thickness, in those cases, may be more nearly equal to or even greater than stripe width. Bias field is chosen to provide bubble diameter approximately equal to stripe width.

The quantities in Table 1 are not independent. Consequently, there are only certain regions of the (h,w) space that are accessible to the specifications at a given Q value. A guide to determining the accessible regions is provided in D. M. Gualtieri, IEEE Trans. on Mag., Vol. MAG-16(6), 1440 (1980).

The garnet films of the present invention are grown by the liquid phase epitaxy method, which has been described by S. L. Blank et al., J. Cryst. Growth 17, 302 (1972). A substrate, preferably GGG, is held at the end of a rod and, while rotating about a vertical axis in the plane of the substrate, the substrate is dipped into a supersaturated solution of the proper composition and temperature.

The following examples are presented in order to provide a more complete understanding of the invention. The specific techniques, conditions, materials, and reported data set forth to illustrate the principle and practice of the invention are exemplary and should not be construed as limiting the scope of the invention.

EXAMPLES 1 and 2

Bubble films were grown by liquid phase epitaxy onto (lll)-oriented GGG substrates by the process described by S. L. Blank et al., op. cit. The unidirectional substrate rotation rate in each case was 200 rev/min., with a supercooling of about 7.5° C. The melt composition is set out below. The "R" parameters are those described by S. L. Blank et al., IEEE Trans. on Mag., Vol. MAG-13(5), 1095 (1977), and $RE_2O_3$ symbolizes the total amount of rare earth, or yttrium, oxides. An advantage of this melt composition is that flux-spotting is minimized.

$R_1 = Fe_2O_3/RE_2O_3 = 15.0$ $R_2 = 2Fe_2O_3/GeO_2 = 9.8$ $R_3 = PbO/2B_2O_3 = 7.4$ $R_4 =$ solute concentration $= 0.24$ $R_5 = CaO/(GeO_2 + CaO) = 0.45$ $La_2O_3/RE_2O_3 = 0.10$ $Sm_2O_3/RE_2O_3 = 0.24$ $Tm_2O_3/RE_2O_3 = 0.10$ $Lu_2O_3/RE_2O_3 = 0.56$ X-ray fluorescence spectroscopy of the films yielded a nominal composition of $Tm_{0.50}Ca_{0.55}La_{0.05}Sm_{0.79}Lu_{1.56}Fe_{3.57}Ge_{0.48}O_{12.50}$ Note, as was indicated earlier, the experimentally-determined subscripts do not, in general, correspond exactly to the nominal subscripts shown in the formula unit.

EXAMPLE 3

The process of Examples 1 and 2 was used with the melt composition below. The unidirectional substrate rotation rate in each case was 200 rev/min., with a supercooling of about 6.0° C.

$R_1 = Fe_2O_3/RE_2O_3 = 15$ $R_2 = 2Fe_2O_3/GeO_2 = 10.0$ $R_3 = PbO/2B_2O_3 = 7.4$ $R_4 =$ solute concentration $= 0.24$ $R_5 = CaO/(GeO_2 + CaO) = 0.45$ $La_2O_3/RE_2O_3 = 0.18$ $Sm_2O_3/RE_2O_3 = 0.22$ $Tm_2O_3/RE_2O_3 = 0.20$ $Lu_2O_3/RE_2O_3 = 0.40$ Table 2 lists the growth parameters and resulting film properties. The calculated properties were derived by using the approach discussed in D. M. Gualtieri, op. cit. The quality factor and anisotropy field were found from ferrimagnetic resonance measurements. The $\oplus a_{bc}|$ values are the slope at 50° C. of the second-order polynomial fit of collapse field data taken at 5° intervals from 25°–100° C.

The FIGURE shows (closed circles) the temperature dependence of bubble collapse field of the compositions of Examples 1 and 3. It also shows (open circles) the temperature dependence of a 1.2 μm bubble composition that has Ga- rather than (Ca,Ge)-substitution for Fe. It is noteworthy that both compositions of the present invention show superior linearity, compared with the Ga-substituted.

TABLE 2

| Example | 1 | 2 | 3 |
| --- | --- | --- | --- |
| Growth temp. (°C.) | 968.0 | 967.5 | 969.5 |
| Growth rate (μm/min) | 0.65 | 0.68 | 0.42 |
| Thickness (μm) | 1.23 | 1.42 | 1.11 |
| Stripe width (μm) | 1.26 | 1.33 | 1.22 |
| Curie temp. (K) | 485.6 | 485.6 | 493.4 |
| Collapse field (Oe) | 322.8 | 350.8 | 323.3 |
| Exchange const. ($10^{-7}$ erg/cm) | 2.96 | 2.96 | 3.09 |
| Magnetization ($4\pi M_s$, G) | 648 | 645 | 659 |
| Characteristic length (μm) | 0.141 | 0.140 | 0.142 |
| Anisotropy const. ($10^4$ erg/cm$^3$) | 4.64 | 4.56 | 4.85 |
| Quality factor | 3.23 | 3.31 | 2.63 |
| Anisotropy field (Oe) | 2090 | 2135 | 1730 |
| Lattice const. (nm) (corrected for strain) | 1.23864 | 1.23870 | 1.23890 |
| Film-substrate lattice const. mismatch (pm) (corrected for strain) | +0.24 | +0.24 | +0.73 |
| Temp. coef. of collapse field (%/°C. at 50° C.) | −0.255 | — | −0.222 |

We claim:

1. An iron garnet layer that is capable of supporting magnetic bubble domains and that has a composition nominally represented by the formula $Tm_{0.50}Ca_{0.55}La_{0.05}Sm_{0.79}Lu_{1.56}Fe_{3.57}Ge_{0.48}O_{12.50}.$ 2. A magnetic bubble domain device comprising a layer of claim 1:

a magnet for maintaining in the layer a magnetic field that varies with temperature throughout a temperature range at an average variation rate;

means adjacent to the layer for generating and moving the domains in the layer; and a substrate for supporting the device, whereby a bubble collapse field of the layer varies with temperature throughout the temperature range at about the average variation rate.

3. The device of claim 2 in which the magnet is barium ferrite.

4. The device of claim 2 in which the substrate is gadolinium gallium garnet.

5. The device of claim 4 in which the orientation of the substrate is (111).

* * * * *